US012628273B2

(12) United States Patent
Hu et al.

(10) Patent No.:    US 12,628,273 B2
(45) Date of Patent:        May 12, 2026

(54) FLEXIBLE CIRCUIT TAPE AND FLEXIBLE CIRCUIT BOARD THEREOF

(71) Applicant: CHIPBOND TECHNOLOGY CORPORATION, Hsinchu (TW)

(72) Inventors: Chih-Hsiung Hu, Taoyuan City (TW); Chun-Te Lee, Hsinchu County (TW); Shyh-Jen Guo, Hsinchu City (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 215 days.

(21) Appl. No.: 18/768,605

(22) Filed:        Jul. 10, 2024

(65)                Prior Publication Data

US 2025/0071895 A1        Feb. 27, 2025

(30)        Foreign Application Priority Data

Aug. 25, 2023        (TW) ................................. 112209155

(51) Int. Cl.
H05K 1/03            (2006.01)

(52) U.S. Cl.
CPC ....... H05K 1/0393 (2013.01); H05K 2201/05 (2013.01); H05K 2201/09063 (2013.01); H05K 2201/10386 (2013.01)

(58) Field of Classification Search
CPC .......... H05K 1/03; H05K 1/0393; H05K 1/14; H05K 1/189; H05K 13/0076; H05K 2201/09063
USPC ........................................................ 174/254
See application file for complete search history.

(56)                References Cited

FOREIGN PATENT DOCUMENTS

| JP | 63-280499 A | 11/1988 |
| JP | 05-074865 A | 3/1993 |
| JP | 07-240495 A | 9/1995 |
| JP | 2002-124544 A | 4/2002 |

OTHER PUBLICATIONS

Korean office action mailed Jun. 16, 2025 for Korean utility model application No. 20-2024-0001357, 10 pages.

*Primary Examiner* — Tremesha W Burns
(74) *Attorney, Agent, or Firm* — Demian K. Jackson; Jackson IPG PLLC

(57)                ABSTRACT

A flexible circuit tape includes flexible circuit boards each including a substrate unit and a circuit unit. The circuit unit is disposed on a routing region of the substrate unit and includes circuit lines each having an inner lead and an outer lead. A second width between the two outermost outer leads accounts for 60.00-99.00% of a first width of the substrate unit. The first width is greater than or equal to 80 mm such that number of outer leads can be increased.

18 Claims, 6 Drawing Sheets

FLEXIBLE CIRCUIT TAPE AND FLEXIBLE CIRCUIT BOARD THEREOF

CROSS-REFERENCE TO RELATED APPLICATIONS

This application claims priority to R.O.C patent application No. 112209155 filed Aug. 25, 2023, the disclosure of which is hereby incorporated by reference in its entirety.

FIELD OF THE INVENTION

This invention relates to a flexible circuit tape and flexible circuit board, and more particularly to a flexible circuit tape and flexible circuit board with more circuit lines and outer leads.

BACKGROUND OF THE INVENTION

In conventional display, a circuit board is electrically connected to a display panel via a flexible circuit board, and a driver IC mounted on the flexible circuit board is used to control LEDs on the display panel. More LEDs with smaller size are necessary for minimization requirement of electronic product.

More than one flexible circuit board is required to be electrically connected to the display panel for the more LEDs. However, assembly process and electronic control become difficult while bonding multiple flexible circuit boards to the display panel. In addition, due to restricted space in the electronic product, the flexible circuit boards may be over-bent and separate from the display panel to lower yield or reliability of the display.

SUMMARY OF THE INVENTION

One object of the present invention is to provide a flexible circuit tape and a flexible circuit board. Width of a substrate unit can be increased and width between two outermost outer leads of a circuit unit accounts for 60.00-99.00% of the width of the substrate unit such that more outer leads can be arranged on the circuit unit to be conformity with numbers of contacts of an external electronic component (e.g. display panel) for electrical connection of the flexible circuit board and the external electronic component.

A flexible circuit tape of the present invention includes a flexible carrier and a circuit layer. The flexible carrier includes substrate units arranged in a first direction for transporting the flexible carrier, each of the substrate units includes a first side, a second side and a routing region which is located between the first and second sides in a second direction perpendicular to the first direction. The circuit layer includes circuit units disposed on the routing region, and a flexible circuit board involves one of the substrate units and one of the circuit units. Each of the circuit units includes first circuit lines each having a first inner lead and a first outer lead, the first inner lead is located on a chip mounting area within the routing region, the first outer lead is located outside the chip mounting area. A first width between the first and second sides of each of the substrate units in the second direction is greater than or equal to 80 mm, and a second width from the first outer lead adjacent to the first side to the first outer lead adjacent to the second side accounts for 60.00-99.00% of the first width.

A flexible circuit board of the present invention includes a substrate unit and a circuit unit. The substrate unit includes a first side, a second side and a routing region which is located between the first and second sides in a second direction perpendicular to a first direction. The circuit unit is disposed on the routing region and includes first circuit lines each having a first inner lead and a first outer lead. The first inner lead is located on a chip mounting area within the routing region, and the first outer lead is located outside the chip mounting area. A first width between the first and second sides of the substrate unit in the second direction is greater than or equal to 80 mm, and a second width from the first outer lead adjacent to the first side to the first outer lead adjacent to the second side accounts for 60.00-99.00% of the first width.

In the present invention, the first width of the substrate unit can be increased to allow more first outer leads to be arranged on the circuit unit such that numbers of the first outer leads on the flexible circuit board can be conformity with numbers of contacts on an external electronic component, e.g. display panel, and the flexible circuit board can be electrically connected to the external electronic component. Furthermore, difficulty of assembly and electricity control can be reduced during bonding the flexible circuit board with the display panel to allow the flexible circuit board to be put in an electronic product easily.

DETAILED DESCRIPTION OF THE INVENTION

Figure 1:
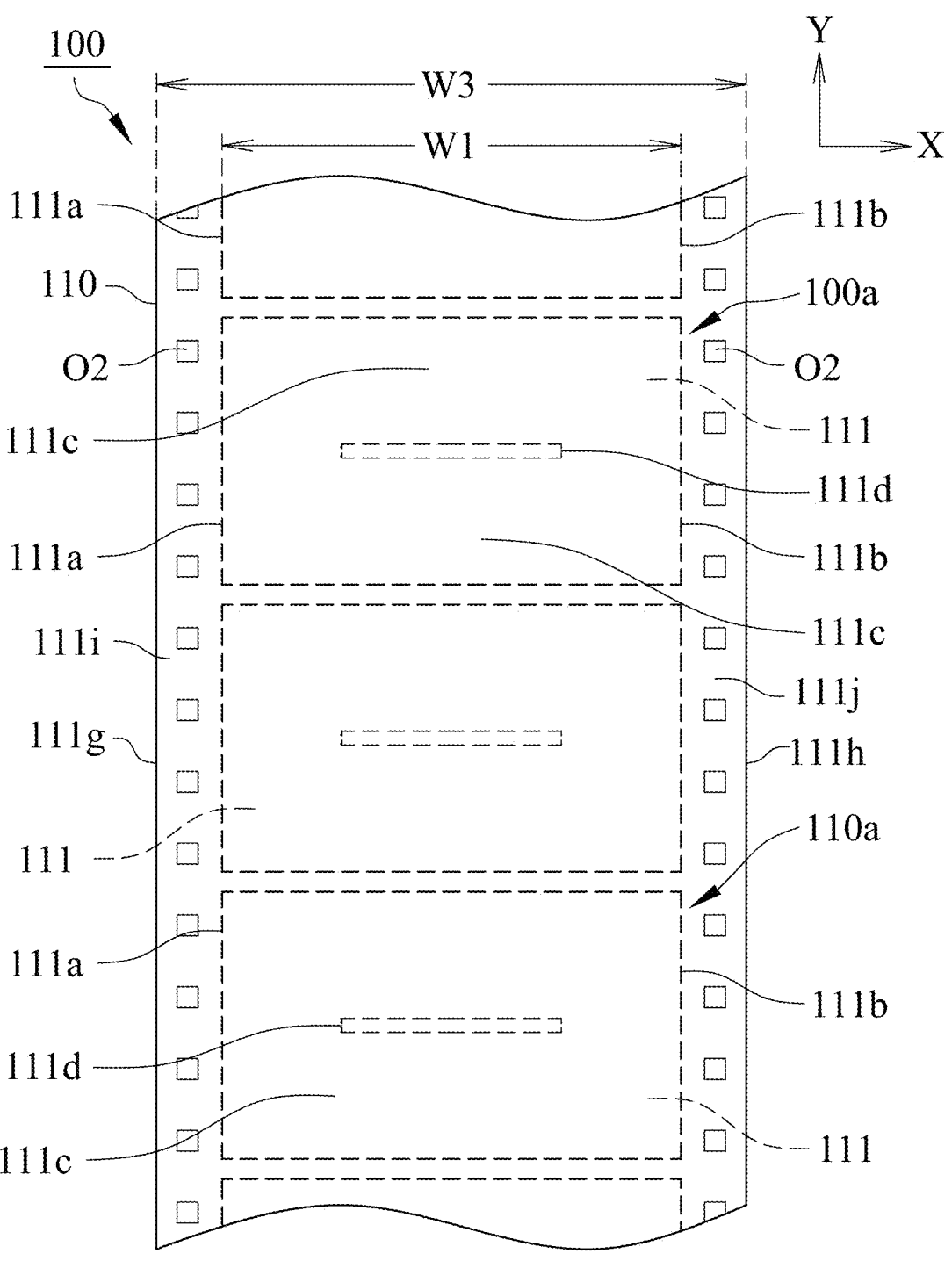
FIG. 1 is top view diagram illustrating a flexible circuit tape in accordance with one embodiment of the present invention.
Figure 2:
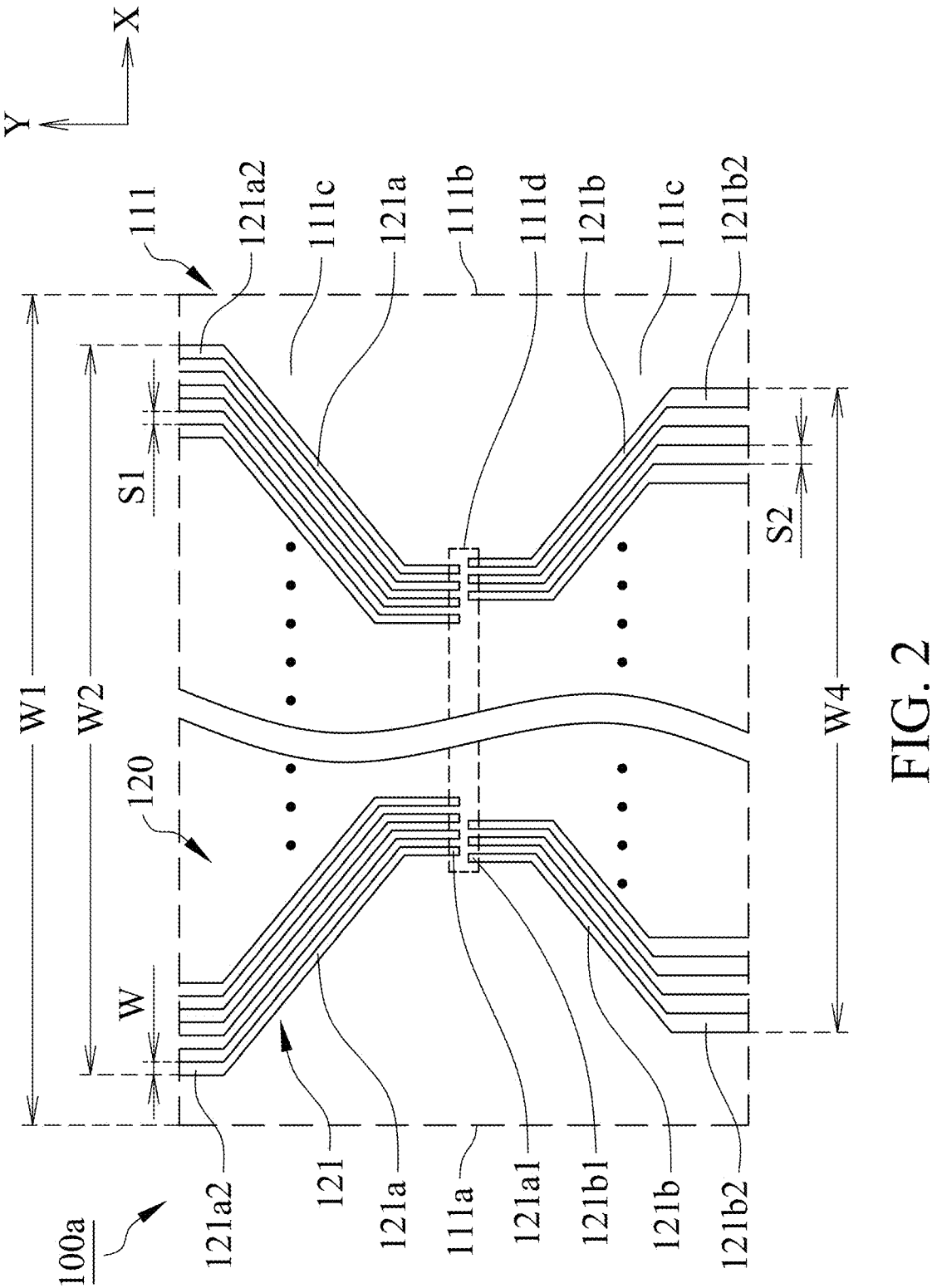
FIG. 2 is a top view diagram illustrating a flexible circuit board in accordance with first embodiment of the present invention.
Figure 3:
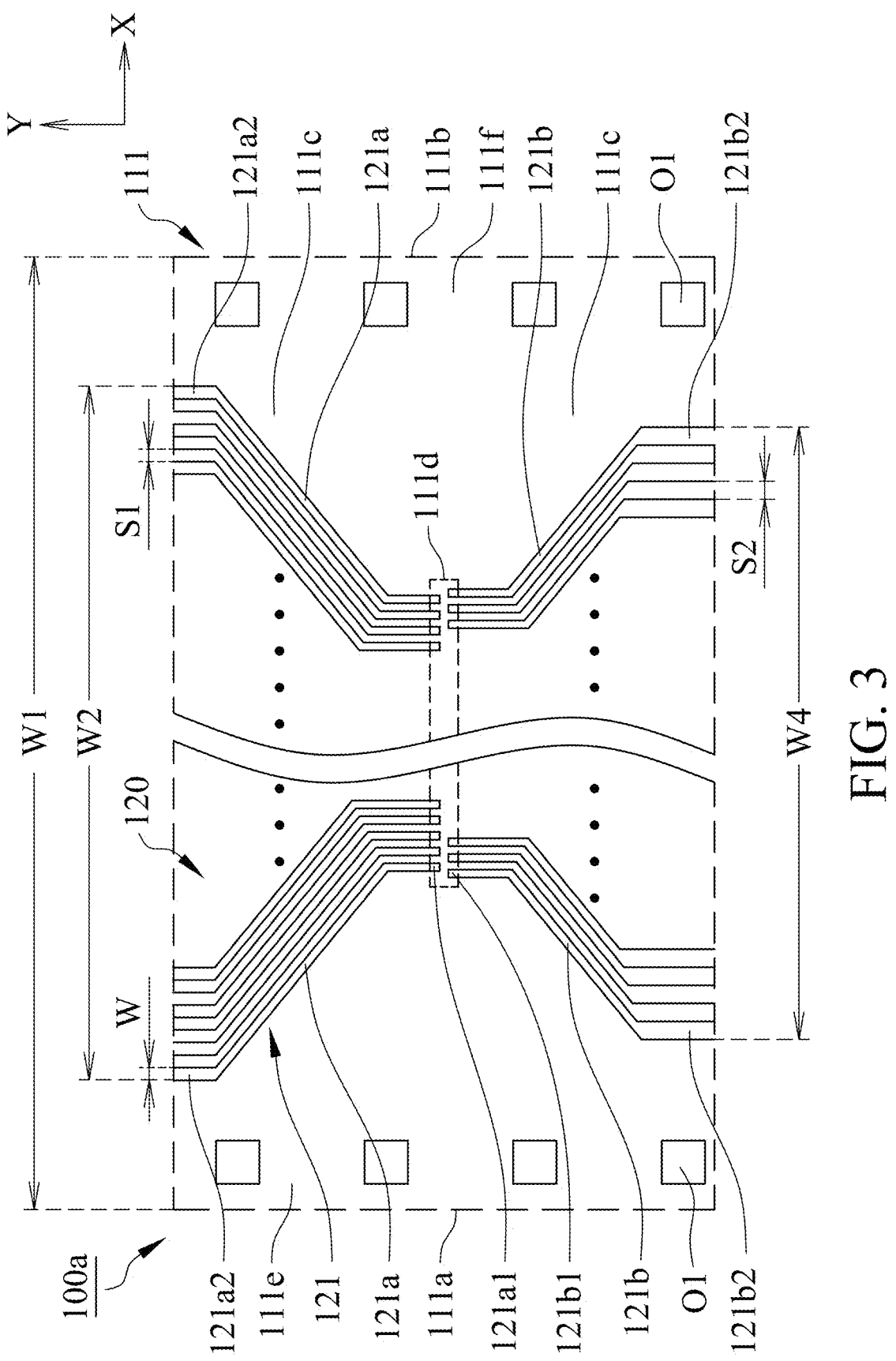
FIG. 3 is a top view diagram illustrating a flexible circuit board in accordance with second embodiment of the present invention.
Figures 4, 5:
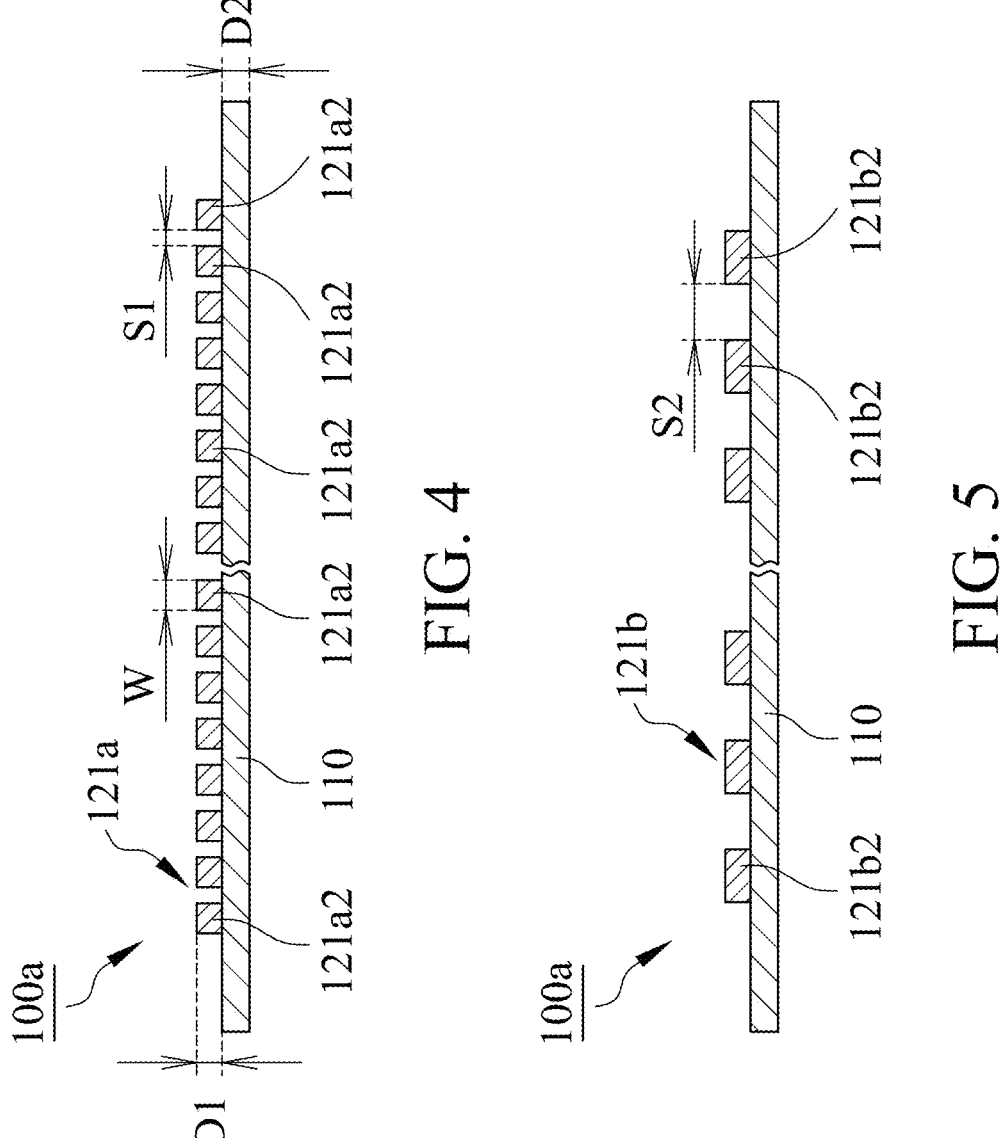
FIG. 4 is a cross-section view diagram illustrating a flexible circuit board in accordance with one embodiment of the present invention.
FIG. 5 is a cross-section view diagram illustrating a flexible circuit board in accordance with one embodiment of the present invention.

With reference to FIGS. 1 to 3, a flexible circuit tape 100 includes a flexible carrier 110 and a circuit layer 120, and there are substrate units 111 arranged on the flexible carrier 110 in a first direction Y for transporting the flexible carrier 110. Each of the substrate units 111 has a first side 111*a*, a second side 111*b* and a routing region 111*c* which is located between the first side 111*a* and the second side 111*b* in a second direction X perpendicular to the first direction Y. The width from the first side 111*a* to the second side 111*b* in the second direction X is defined as a first width W1. Preferably, after cutting the flexible carrier 110, the first side 111*a* and the second side 111*b* are cutting sides of each of the substrate units 111.

Figure 6:
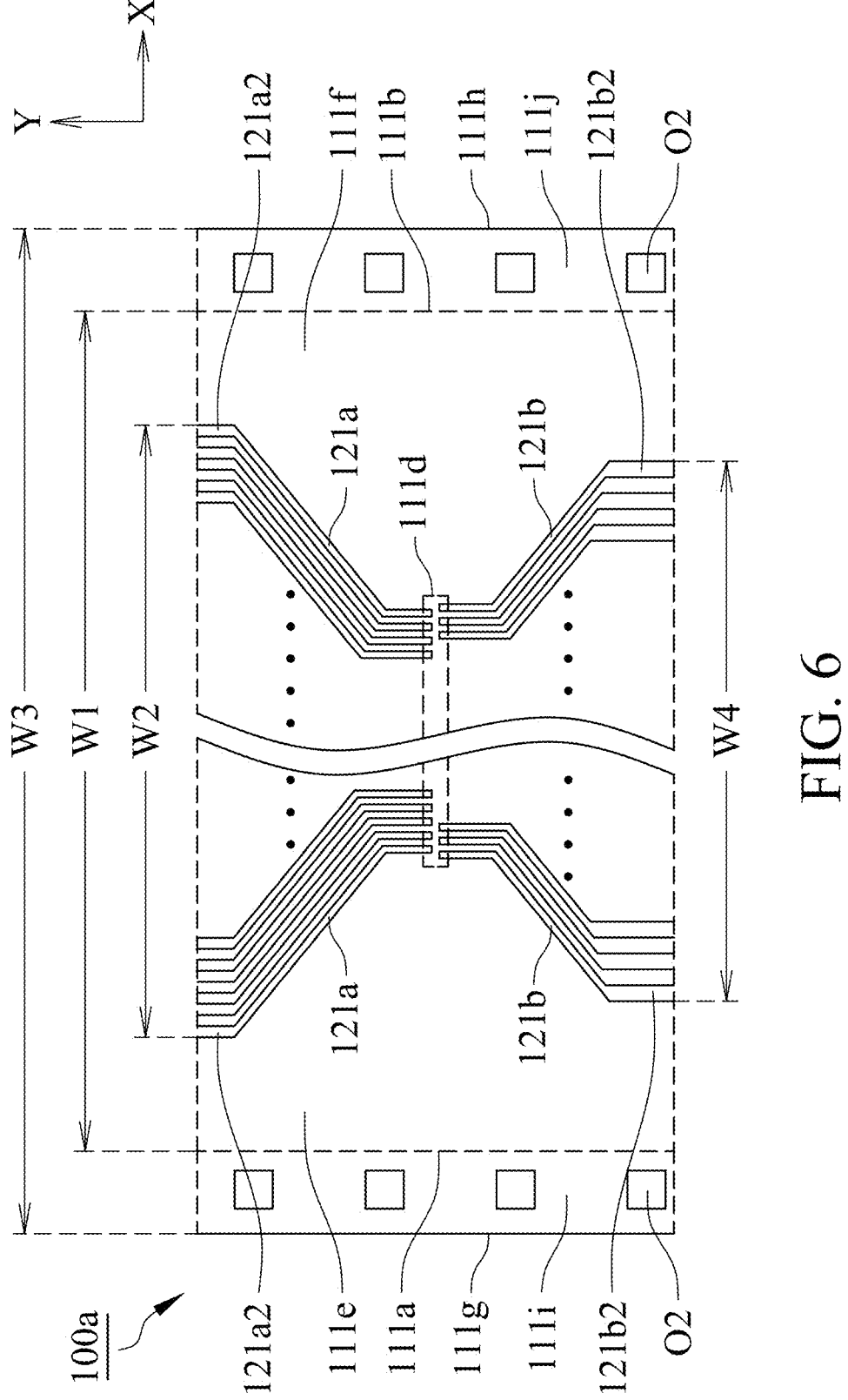
FIG. 6 is a top view diagram illustrating a flexible circuit board in accordance with first embodiment of the present invention.
Figure 7:
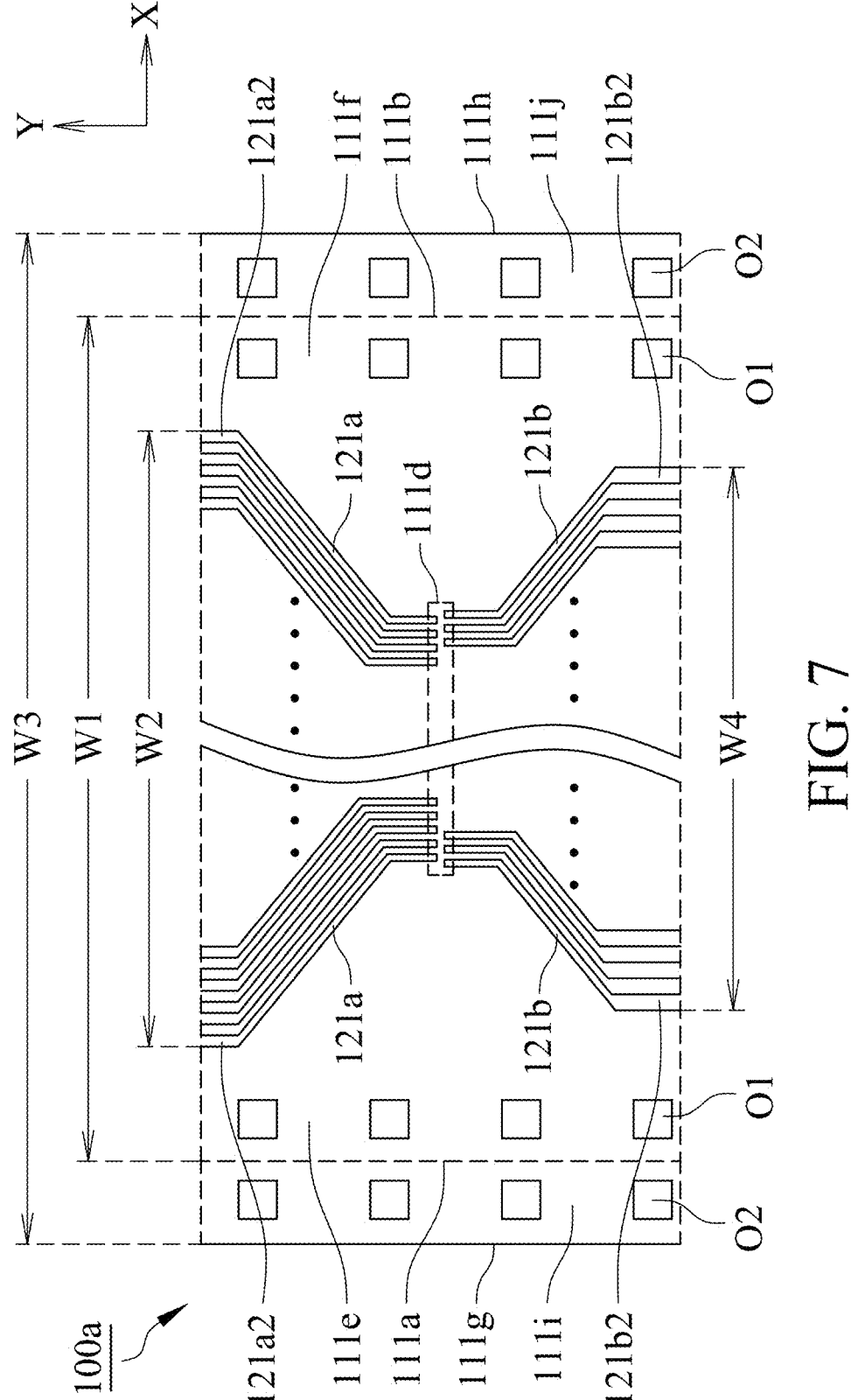
FIG. 7 is a top view diagram illustrating a flexible circuit board in accordance with second embodiment of the present invention.

A first embodiment of the present invention is shown in FIGS. 2 and 6, and a second embodiment of the present invention is shown in FIGS. 3 and 7. Different to the first embodiment, the substrate unit 111 of the second embodiment further has a first transport region 111*e* and a second transport region 111*f*. Along the second direction X, the first transport region 111*e* is located between the routing region 111*c* and the first side 111*a*, and the second transport region 111*f* is located between the routing region 111*c* and the second side 111*b*. Preferably, first sprocket holes O1 are arranged on the first transport region 111*e* and the second transport region 111*f* along the first direction Y.

With reference to FIGS. 1 to 3, the circuit layer 120 includes circuit units 121 disposed on the routing region 111*c* of each of the substrate units 111. A flexible circuit board 100*a* includes one of the substrate units 111 and one of the circuit units 121. Each of the circuit units 121 includes first circuit lines 121*a* each having a first inner lead 121*a*1 and a first outer lead 121*a*2. The first inner lead 121*a*1 is located on a chip mounting area 111*d* within the routing region 111*c* and provided to be electrically connected to a chip, the first outer lead 121*a*2 is located outside the chip mounting area 111*d* and provided to be electrically connected to an external electronic component, e.g. display panel. Preferably, the flexible circuit board 100*a* further includes a solder resist layer (not shown) provided to cover the first circuit lines 121*a*, except the first inner lead 121*a*1 and the first outer lead 121*a*2. Along the second direction X, the width between the first outer lead 121*a*2 adjacent to the first side 111*a* and another first outer lead 121*a*2 adjacent to the second side 111*b* is defined as a second width W2. The second width W2 accounts for 60.00-99.00% of the first width W1 defined from the first side 111*a* to the second side 111*b* of the substrate unit 111, and the first width W1 is greater than or equal to 80 mm. The first width W1 can be increased to arrange more first inner leads 121*a*1 and first outer leads 121*a*2. Thus, numbers of the first inner leads 121*a*1 can be conformity with numbers of contacts (such as pads or bumps) on the chip, and numbers of the first outer leads 121*a*2 can be conformity with numbers of contacts on the external electronic component (e.g. display panel) for electrical connection of the flexible circuit board 100*a* with the chip and the display panel.

With reference to FIGS. 2 and 3, each of the circuit units 121 may further includes second circuit lines 121*b*, and the chip mounting area 111*d* is located between the first circuit lines 121*a* and the second circuit lines 121*b* in the first direction Y. Each of the second circuit lines 121*b* has a second inner lead 121*b*1 and a second outer lead 121*b*2, the second inner lead 121*b*1 is located on the chip mounting area 111*d* and provided to electrically connect to the chip, and the second outer lead 121*b*2 is located outside the chip mounting area 111*d* and provided to electrically connected to another external electronic component, e.g. a circuit board. In the second direction X, the width from the second outer lead 121*b*2 adjacent to the first side 111*a* to another second outer lead 121*b*2 adjacent to the second side 111*b* is defined as a fourth width W4. The fourth width W4 accounts for 30.00-99.00% of the first width W1 defined from the first side 111*a* to the second side 111*b* of the substrate unit 111. The first width W1 can be increased to arrange more second inner leads 121*b*1 and second outer leads 121*b*2 such that numbers of the second inner leads 121*b*1 can be conformity with numbers of contacts (such as pads or bumps) on the chip, and numbers of the second outer leads 121*b*2 can be conformity with numbers of contacts on the external electronic component (e.g. circuit board) for electrical connection of the flexible circuit board 100*a* with the chip and the circuit board.

With reference to FIGS. 2 to 5, along the second direction X, a first space S1 between the adjacent first outer leads 121*a*2 is less than or equal to 25 um and a second space S2 between the adjacent second outer leads 121*b*2 is greater than or equal to the first space S1. A width W of the first outer lead 121*a*2 in the second direction X is less than or equal to 25 um so numbers of the first outer leads 121*a*2 can be increased. Preferably, a first thickness D1 of each of the first circuit lines 121*a* is less than or equal to 12 um and a second thickness D2 of the flexible carrier 110 is less than or equal to 38 um. Thus, the flexible circuit board 100*a* with higher flexibility can be bent for electrical connection with the external electronic components.

With reference to FIGS. 1, 6 and 7, each of the substrate units 111 has a third side 111*g*, a fourth side 111*h*, a third transport region 111*i* and a fourth transport region 111*j*. Along the second direction X, the third transport region 111*i* is located between the first side 111*a* and the third side 111*g*, the fourth transport region 111*j* is located between the second side 111*b* and the fourth side 111*h*, and the width from the third side 111*g* to the fourth side 111*h* is defined as a third width W3. The third width W3 is greater than or equal to 125 mm, and the first width W1 defined from the first side 111*a* to the second side 111*b* accounts for 50.00-98.00% of the third width W3. The first width W1 can be increased to arrange more first inner leads 121*a*1 and the first outer leads 121*a*2 without increasing the third width W3. As a result, numbers of the first inner leads 121*a*1 can be conformity with numbers of contacts (such as pads or bumps) on the chip, and numbers of the first outer leads 121*a*2 can be conformity with numbers of contacts on the external electronic component (e.g. display panel) for electrical connection of the flexible circuit board 100*a* with the chip and the external electronic component. Preferably, second sprocket holes O2 are arranged on the third transport region 111*i* and the fourth transport region 111*j* along the first direction Y.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

The invention claimed is:

1. A flexible circuit tape comprising:
   a flexible carrier including a plurality of substrate units arranged in a first direction for transporting the flexible carrier, each of the plurality of substrate units includes a first side, a second side and a routing region which is located between the first and second sides in a second direction perpendicular to the first direction; and
   a circuit layer including a plurality of circuit units disposed on the routing region, a flexible circuit board includes one of the plurality of substrate units and one of the plurality of circuit units, each of the plurality of circuit units includes a plurality of first circuit lines each having a first inner lead and a first outer lead, the first inner lead is located on a chip mounting area within the routing region, the first outer lead is located outside the chip mounting area, wherein a first width between the first and second sides of each of the plurality of substrate units is greater than or equal to 80 mm in the second direction, and a second width from the first outer lead adjacent to the first side to the first outer lead adjacent to the second side accounts for 60.00-99.00% of the first width.

2. The flexible circuit tape in accordance with claim 1, wherein a first space between the first outer lead of the adjacent first circuit lines is less than or equal to 25 um in the second direction.

3. The flexible circuit tape in accordance with claim 2, wherein a width of the first outer lead is less than or equal to 25 um in the second direction.

4. The flexible circuit tape in accordance with claim 3, wherein a first thickness of each of the plurality of first circuit lines is less than or equal to 12 um.

5. The flexible circuit tape in accordance with claim 4, wherein a second thickness of the flexible carrier is less than or equal to 38 um.

6. The flexible circuit tape in accordance with claim 1, wherein each of the plurality of substrate units further includes a first transport region and a second transport region, the first transport region is located between the routing region and the first side, and the second transport region is located between the routing region and the second side in the second direction.

7. The flexible circuit tape in accordance with claim 6, wherein each of the plurality of substrate units further includes a third side, a fourth side, a third transport region and a fourth transport region, the third transport region is located between the first and third sides and the fourth transport region is located between the second and fourth sides in the second direction, a third width between the third and fourth sides is greater than or equal to 125 mm in the second direction, and the first width accounts for 50.00-98.00% of the third width.

8. The flexible circuit tape in accordance with claim 1, wherein each of the plurality of circuit units further includes a plurality of second circuit lines, the chip mounting area is located between the plurality of first and second circuit lines in the first direction, each of the plurality of second circuit lines includes a second inner lead located on the chip mounting area and a second outer lead located outside the chip mounting area, a fourth width from the second outer lead adjacent to the first side to the second outer lead adjacent to the second side accounts for 30.00-99.00% of the first width.

9. The flexible circuit tape in accordance with claim 8, wherein a first space between the first outer lead of the adjacent first circuit lines is less than or equal to 25 um in the second direction, and a second space between the second outer lead of the adjacent second circuit lines is greater than or equal to the first space.

10. The flexible circuit tape in accordance with claim 1, wherein the first and second sides are cutting sides of each of the plurality of substrate units.

11. A flexible circuit board comprising:

a substrate unit of a flexible carrier including a first side, a second side and a routing region which is located between the first and second sides in a second direction perpendicular to a first direction for transporting the flexible carrier; and a circuit unit disposed on the routing region and including a plurality of first circuit lines, each of the plurality of first circuit lines includes a first inner lead and a first outer lead, the first inner lead is located on a chip mounting area within the routing region, the first outer lead is located outside the chip mounting area, wherein a first width between the first and second sides of the substrate unit is greater than or equal to 80 mm in the second direction, and a second width from the first outer lead adjacent to the first side to the first outer lead adjacent to the second side accounts for 60.00-99.00% of the first width.

12. The flexible circuit board in accordance with claim 11, wherein a first space between the first outer lead of the adjacent first circuit lines is less than or equal to 25 um in the second direction.

13. The flexible circuit board in accordance with claim 12, wherein a width of the first outer lead is less than or equal to 25 um in the second direction.

14. The flexible circuit board in accordance with claim 13, wherein a first thickness of each of the plurality of first circuit lines is less than or equal to 12 um.

15. The flexible circuit board in accordance with claim 14, wherein a second thickness of the flexible carrier is less than or equal to 38 um.

16. The flexible circuit board in accordance with claim 11, wherein the circuit unit further includes a plurality of second circuit lines, the chip mounting area is located between the plurality of first and second circuit lines in the first direction, each of the plurality of second circuit lines includes a second inner lead located on the chip mounting area and a second outer lead located outside the chip mounting area, a fourth width from the second outer lead adjacent to the first side to the second outer lead adjacent to the second side accounts for 30.00-99.00% of the first width.

17. The flexible circuit board in accordance with claim 16, wherein a first space between the first outer lead of the adjacent first circuit lines is less than or equal to 25 um in the second direction, and a second space between the second outer lead of the adjacent second circuit lines is greater than or equal to the first space.

18. The flexible circuit board in accordance with claim 11, wherein the first and second sides are cutting sides of the substrate unit.

* * * * *